US006768200B2

(12) United States Patent
Grill et al.

(10) Patent No.: US 6,768,200 B2
(45) Date of Patent: Jul. 27, 2004

(54) ULTRALOW DIELECTRIC CONSTANT MATERIAL AS AN INTRALEVEL OR INTERLEVEL DIELECTRIC IN A SEMICONDUCTOR DEVICE

(75) Inventors: Alfred Grill, White Plains, NY (US); Vishnubhai V. Patel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/174,749

(22) Filed: Jun. 19, 2002

(65) Prior Publication Data

US 2003/0234450 A1 Dec. 25, 2003

Related U.S. Application Data

(63) Continuation-in-part of application No. PCT/US01/50830, filed on Oct. 25, 2001, which is a continuation of application No. 09/938,949, filed on Aug. 24, 2001, which is a continuation-in-part of application No. 09/769,089, filed on Jan. 25, 2001.
(60) Provisional application No. 60/243,169, filed on Oct. 25, 2000.

(51) Int. Cl.[7] .............................................. H01L 23/48
(52) U.S. Cl. ...................... 257/758; 257/759; 257/760; 257/762
(58) Field of Search ................................. 257/758, 759, 257/760, 762; 438/29, 623, 224, 680

(56) References Cited

U.S. PATENT DOCUMENTS

| 5,141,897 A | 8/1992 | Manocha et al. |
| 5,994,776 A | 11/1999 | Fang et al. |

(List continued on next page.)

FOREIGN PATENT DOCUMENTS

| EP | 0 826 791 A2 | 3/1998 |
| WO | WO 00/244050 | 4/2000 |

OTHER PUBLICATIONS

"Low dielectric constant films prepared by plasma–enhanced chemical vapor deposition from tetramethylsilane", by A. Grill, et al., Journal of Applied Physics, vol. 85, No. 6, Mar. 15, 1999 American Institute of Physics, pp. 3314–3318.

"Low Dielectric Constant SiCOH Films as Potential Candidates for Interconnect Dielectronics", by A. Grill, et al., Mat. Res. Soc. Symp. Proc., vol. 612, 2000 Materials Research Society, pp. 107–116.

"Novel Low–k Dual–phase Materials Prepared by PECVD", by Alfred Grill, et al., Mat. Res. Soc. Symp. Proc., vol. 612, 2000 Materials Research Society, pp. D.2.9.1–D2.9.7.

*Primary Examiner*—Huan Hoang
*Assistant Examiner*—Dao H. Nguyen
(74) *Attorney, Agent, or Firm*—Scully, Scott, Murphy & Presser; Robert M. Trepp

(57) ABSTRACT

There is provided a thermally stable ultralow dielectric constant film comprising Si, C, O and H atoms and having a covalently bonded tri-dimensional network structure and a dielectric constant of not more than 2.6. The dielectric constant film may additionally have a covalently bonded ring network. The covalently bonded tri-dimensional (i.e., three dimensional) network structure comprises Si—O, Si—C, Si—H, C—H and C—C covalent bonds and may optionally contain F and N. In the film, the Si atoms may optionally be partially substituted with Ge atoms. The dielectric constant film has a thickness of not more than 1.3 micrometers and a crack propagation velocity in water of less than $10^{-10}$ meters per second. There is further provided a back-end-of-the-line (BEOL) interconnect structure comprising the inventive dielectric film as a BEOL insulator, cap or hardmask layer.

17 Claims, 6 Drawing Sheets

U.S. PATENT DOCUMENTS

| | | |
|---|---|---|
| 6,068,884 A | 5/2000 | Rose et al. |
| 6,312,793 B1 * | 11/2001 | Grill et al. ............... 428/312.6 |
| 6,333,255 B1 | 12/2001 | Sekiguchi |
| 6,391,932 B1 * | 5/2002 | Gore et al. .................... 521/61 |
| 6,437,443 B1 * | 8/2002 | Grill et al. .................. 257/758 |
| 6,479,110 B2 * | 11/2002 | Grill et al. ................... 427/577 |
| 6,497,963 B1 * | 12/2002 | Grill et al. ................... 428/446 |
| 2002/0142579 A1 * | 10/2002 | Vincent et al. ............. 438/623 |
| 2003/0017635 A1 * | 1/2003 | Apen et al. .................... 438/29 |

* cited by examiner where m = 0 to 5 and n = 0 to 10 where l = 0 to 5, m = 0 to 10; and n =0 to 10

ULTRALOW DIELECTRIC CONSTANT MATERIAL AS AN INTRALEVEL OR INTERLEVEL DIELECTRIC IN A SEMICONDUCTOR DEVICE

CROSS-REFERENCE TO RELATED APPLICATIONS

The present application is a continuation in part of PCT Application No. US01/50830 entitled "An Improved Method For Fabricating An Ultralow Dielectric Constant Material As An Intralevel Or Interlevel Dielectric In A Semiconductor Device" filed on Oct. 25, 2001 which is a continuation of U.S. patent application Ser. No. 09/938,949 to Alfred Grill, et al., entitled "An Improved Method for Fabricating an Ultralow Dielectric Constant Material as an Intralevel or Interlevel Dielectric in a Semiconductor Device" and filed Aug. 24, 2001, which is a continuation in part of U.S. patent application Ser. No. 09/769,089 to Alfred Grill, et al., entitled "An Ultralow Dielectric Constant Material as an Intralevel or Interlevel Dielectric in a Semiconductor Device and Electronic Device Containing the Same" and filed Jan. 25, 2001, which claims the benefit of a U.S. Provisional Application Ser. No. 60/243,169, entitled "An Ultralow Dielectric Constant Material as an Intralevel or Interlevel Dielectric in a Semiconductor Device and Device Made" and filed Oct. 25, 2000.

BACKGROUND OF THE INVENTION

1. Technical Field of the Invention

The present invention generally relates to a method for fabricating a dielectric material that has an ultralow dielectric constant (or ultralow-k) associated therewith and an electronic device containing such a dielectric material. More particularly, the present invention relates to a method for fabricating a thermally stable ultralow-k film for use as an intralevel or interlevel dielectric in an ultra-large-scale integration ("ULSI") back-end-of-the-line ("BEOL") wiring structure and an electronic structure formed by such method.

2. Description of the Prior Art

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances. Dielectric materials (i.e., dielectrics) that have low-k values have been commercially available. For instance, one such material is polytetrafluoroethylene ("PTFE"), which has a k value of 2.0. However, these dielectric materials are not thermally stable when exposed to temperatures above 300~350° C. Integration of these dielectrics in ULSI chips requires a thermal stability of at least 400° C. Consequently, these dielectrics are rendered useless during integration.

The low-k materials that have been considered for applications in ULSI devices include polymers containing Si, C, O and H, such as methylsiloxane, methylsilsesquioxanes, and other organic and inorganic polymers. For instance, a paper (N. Hacker et al. "Properties of new low dielectric constant spin-on silicon oxide based dielectrics." Mat. Res. Soc. Symp. Proc. 476 (1997): 25) described materials that appear to satisfy the thermal stability requirement, even though some of these materials propagate cracks easily when reaching thicknesses needed for integration in the interconnect structure when films are prepared by a spin-on technique. Furthermore, the precursor materials are high cost and prohibitive for use in mass production. In contrast to this, most of the fabrication steps of very-large-scale-integration ("VLSI") and ULSI chips are carried out by plasma enhanced chemical or physical vapor deposition techniques. The ability to fabricate a low-k material by a plasma enhanced chemical vapor deposition ("PECVD") technique using readily available processing equipment will simplify the material's integration in the manufacturing process, reduce manufacturing cost, and create less hazardous waste. A co-pending application (Hydrogenated Oxidized Silicon Carbon Material, U.S. Ser. No. 09/107,567, filed on Jun. 19, 1998) assigned to the common assignee of the present invention and incorporated herein by reference in its entirety, described an ultralow dielectric constant material, consisting of Si, C, O and H atoms, having a dielectric constant not more than 3.6, and exhibiting very low crack propagation velocities.

Another co-pending application (Multiphase Low Dielectric Constant Material and Method of Deposition, U.S. Ser. No. 09/320,495, filed on May 16, 1999) assigned to the common assignee of the present invention and incorporated herein by reference in its entirety, described a dual-phase material, consisting of a matrix composed of Si, C, O, and H atoms, a phase composed of mainly C and H atoms, and having a dielectric constant of not more than 3.2. It should be noted that continued reduction of the dielectric constant of such materials will further improve the performance of electronic devices incorporating such dielectrics.

In view of the foregoing, there is a continued need for developing a dielectric material that has a dielectric constant of not more than about 2.6 and inhibits cracking.

SUMMARY OF THE INVENTION

It is therefore an object of the present invention to provide a method for fabricating an ultralow dielectric constant material having a dielectric constant of not more than about 2.6. More preferably, the dielectric constant for the ultralow-k material is in a range of about 1.6 to about 2.6, and most preferably, the dielectric constant is in a range of about 1.8 to about 2.2. It should be noted that all dielectric constants are relative to a vacuum unless otherwise specified.

It is another object of the present invention to provide a method for fabricating an ultralow dielectric constant material comprising Si, C, O and H atoms from a mixture of at least two precursors, wherein a first precursor is selected from molecules with ring structures comprising SiCOH components and a second precursor is an organic molecule selected from the group consisting of molecules with ring structures.

It is yet another object of the present invention to provide a thermally stable ultralow dielectric constant material comprising Si, C, O and H and having a covalently bonded tri-dimensional network structure, which comprises at least the following covalent bonds Si—O, Si—C, Si—H, C—H and C—C bonds. It is noted that the inventive material is not polymeric, but instead it comprises a random tri-dimensional (i.e., three dimensional) structure having at least the foregoing covalent bonds.

It is a further object of the present invention to provide a method for fabricating an ultralow dielectric constant film in a parallel plate plasma enhanced chemical vapor deposition ("PECVD") reactor.

It is yet a further object of the present invention to provide an improved method for fabricating an ultralow dielectric constant material by depositing a film on a substrate in the presence of $CO_2$ or $CO_2$ and $O_2$, thereby improving uniformity of the deposited film as well as stabilizing the plasma within the PECVD reactor.

It is another object of the present invention to provide a method for fabricating an ultralow dielectric constant material for use in electronic structures as an intralevel or interlevel dielectric in a back-end-of-the-line ("BEOL") interconnect structure.

It is yet another object of the present invention to provide a thermally stable ultralow dielectric constant material that has low internal stresses and a dielectric constant of not higher than about 2.6. More preferably, the dielectric constant for the ultralow-k material is in a range of about 1.6 to about 2.6 and, most preferably, the dielectric constant is in a range of about 1.8 to about 2.2.

It is still another object of the present invention to provide an electronic structure incorporating layers of insulating materials as intralevel or interlevel dielectrics in a back-end-of-the-line ("BEOL") wiring structure in which at least two of the layers of insulating materials comprise an ultralow dielectric constant material of the present invention.

It is yet a further object of the present invention to provide an electronic structure, which has layers of the inventive ultralow dielectric constant material as intralevel or interlevel dielectrics in a back-end-of-the-line ("BEOL") wiring structure and which further contains at least one dielectric cap layer as a reactive ion etch ("RIE") mask polish stop or a diffusion barrier.

In accordance with the present invention, there is provided a method for fabricating a thermally stable dielectric material that has a matrix comprising Si, C, O, and H atoms and that has a covalently bonded tri-dimensional network structure comprising Si—O, Si—C, Si—H, C—H and C—C covalent bonds and having an atomic level of nanoporosity. The dielectric material may further optionally include F and N and have Si atoms at least partially substituted by Ge. Additionally, the dielectric material may have a covalently bonded ring network. In a preferred embodiment, the dielectric material has a matrix that consists essentially of Si, C, O, and H. The present invention further provides a method for fabricating the dielectric material by reacting a first precursor gas comprising atoms of Si, C, O, and H, a second precursor gas comprising atoms of C, H, and optionally O, F and N and optionally at least a third precursor gas comprising Ge in a plasma enhanced chemical vapor deposition ("PECVD") reactor. The present invention yet further provides for mixing the first precursor gas with $CO_2$, or mixing the first and second precursor gases with $CO_2$ and $O_2$, thereby stabilizing the plasma in the PECVD reactor and improving the uniformity of the dielectric film deposited on the substrate. The present invention still further provides an electronic structure (i.e., substrate) that has layers of insulating materials as intralevel or interlevel dielectrics used in a back-end-of-the-line ("BEOL") wiring structure, wherein the insulating material can be the ultralow-k film of present invention.

In a preferred embodiment, there is provided a method for fabricating a thermally stable ultralow dielectric constant (ultralow-k) film comprising the steps of: providing a plasma enhanced chemical vapor deposition ("PECVD") reactor; positioning an electronic structure (i.e., substrate) in the reactor; flowing a first precursor gas comprising atoms of Si, C, O, and H into the reactor; flowing a second precursor gas mixture comprising atoms of C, H and optionally O, F and N into the reactor; optionally flowing a third precursor gas comprising Ge; and depositing an ultralow-k film on the substrate. The depositing step may be performed in the presence of $CO_2$ or $CO_2$ and $O_2$. Preferably, the first precursor is selected from molecules with ring structures comprising SiCOH components such as 1, 3, 5, 7-tetramethylcyclotetrasiloxane ("TMCTS" or "$C_4H_{16}O_4Si_4$"). The second precursor may be an organic molecule selected from the group consisting of molecules with ring structures, preferably with more than one ring present in the molecule. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). The third precursor may be formed from germane hydride or any other reactant comprising a source Ge.

Optionally, the deposited film of the present invention can be heat treated at a temperature of not less than about 300° C. for a time period of at least about 0.25 hour. The method may further comprise the step of providing a parallel plate reactor, which has a conductive area of a substrate chuck between about 300 $cm^2$ and about 700 $cm^2$, and a gap between the substrate and a top electrode between about 1 cm and about 10 cm. A high frequency RF power is applied to one of the electrodes at a frequency between about 12 MHZ and about 15 MHZ. Optionally, an additional low frequency power can be applied to one of the electrodes. The heat-treating step may further be conducted at a temperature not higher than about 300° C. for a first time period and then at a temperature not lower than about 380° C. for a second time period, the second time period being longer than the first time period. The second time period may be at least about 10 times the first time period.

The deposition step for the ultralow dielectric constant film of the present invention may further comprise the steps of: setting the substrate temperature at between about 25° C. and about 400° C.; setting the high frequency RF power density at between about 0.05 $W/cm^2$ and about 2.0 $W/cm^2$; setting the first precursor flow rate at between about 5 sccm and about 1000 sccm; setting the flow rate of the second precursor between about 5 sccm and about 1000 sccm; setting the reactor pressure at a pressure between about 50 mTorr and about 5000 mTorr; and setting the high frequency RF power between about 15 W and about 500 W. Optionally, an ultralow frequency power may be added to the plasma between about 10 W and about 300 W. When the conductive area of the substrate chuck is changed by a factor of X, the RF power applied to the substrate chuck is also changed by a factor of X.

In another preferred embodiment, there is provided a method for fabricating an ultralow-k film comprising the steps of: providing a parallel plate type chemical vapor deposition reactor that has plasma enhancement; positioning a pre-processed wafer on a substrate chuck which has a conductive area of between about 300 $cm^3$ and about 700 $cm^2$ and maintaining a gap between the wafer and a top electrode between about 1 cm and about 10 cm; flowing a first precursor gas comprising cyclic siloxane molecules into the reactor; flowing at least a second precursor gas comprising organic molecules with ring structures including C, H and O atoms; flowing a third precursor gas comprising Ge; and depositing an ultralow-k film on the wafer. The depositing step may be performed in presence of $CO_2$ or $CO_2$ and $O_2$. The process may further comprise the step of heat-treating the film after the deposition step at a temperature of not less than about 300° C. for at least about 0.25 hour. The process may further comprise the step of applying a RF power to the wafer. The heat-treating step may further be conducted at a temperature of not higher than about 300° C. for a first time period and then at a temperature not lower than about 380° C. for a second time period, the second time period being longer than the first time period. The second time period may be at least about 10 times the first time period.

The cyclic siloxane precursor utilized can be tetramethylcyclotetrasiloxane ("TMCTS") and the organic precursor can be cyclopentene oxide ("CPO"). The deposition step for the ultralow-k film may further comprise the steps of: setting the wafer temperature at between about 25° C. and about 400° C.; setting a RF power density at between about 0.05 $W/cm^2$ and about 2.0 $W/cm^2$; setting the flow rate of the cyclic siloxane between about 5 sccm and about 1000 sccm; setting the flow rate of the organic precursor between about 5 sccm and about 1000 sccm; setting the flow rate for the third precursor between about 5 sccm and 1000 sccm; and setting the pressure reactor at between about 50 mTorr and about 5000 mTorr. Additionally, the deposition step may further comprise setting a flow ratio of cyclopentene oxide to tetramethylcyclotetrasiloxane to between about 0.1 and about 0.7, preferably between 0.2 and 0.4. The conductive area of the substrate chuck can be changed by a factor X, which leads to a change in RF power by the same factor X.

In still another preferred embodiment, there is provided a method for fabricating a thermally stable ultralow-k dielectric film comprising the steps of: providing a plasma enhanced chemical vapor deposition reactor of a parallel plate type; positioning a wafer on a substrate chuck that has a conductive area between about 300 $cm^2$ and about 700 $cm^2$ and maintaining a gap between the wafer and a top electrode between about 1 cm and about 10 cm; flowing a precursor gas mixture of a cyclic siloxane with a cyclic organic molecule and Ge into the reactor over the wafer, which is kept at a temperature between about room temperature and about 400° C. and preferably between about 60° C. and about 200° C., at a total flow rate between about 25 sccm and about 500 sccm while keeping the reactor pressure at between about 100 mTorr and about 5000 mTorr; depositing a dielectric film on the wafer under a RF power density between about 0.25 $W/cm^2$ and about 0.8 $W/cm^2$; and annealing the ultralow-k film at a temperature of not less than about 300° C. for at least about 0.25 hour. The depositing may be performed in the presence of $CO_2$ or $CO_2$ and $O_2$. The inventive method may further comprise the step of annealing the film at a temperature of not higher than about 300° C. for a first time period and then at a temperature not lower than about 380° C. for a second time period, wherein the second time period is longer than the first time period. The second time period may be set at least about 10 times the first time period. The cyclic siloxane precursor can be tetramethylcyclotetrasiloxane ("TMCTS") and the cyclic organic precursor can be cyclopentene oxide ("CPO").

The present invention is further directed to an electronic structure which has layers of insulating materials as intralevel or interlevel dielectrics in a back-end-of-the-line ("BEOL") interconnect structure which includes a pre-processed semi-conducting substrate that has a first region of metal embedded in a first layer of insulating material, a first region of conductor embedded in a second layer of insulating material of the inventive ultralow-k dielectric, the ultralow-k dielectric comprising Si, C, O and H and having a covalently bonded tri-dimensional network structure and a dielectric constant of not more than about 2.6, the second layer of insulating material being in intimate contact with the first layer of insulating material, the first region of conductor being in electrical communication with the first region of metal, and a second region of conductor being in electrical communication with the first region of conductor and being embedded in a third layer of insulating material comprising the inventive ultralow-k dielectric, the third layer of insulating material being in intimate contact with the second layer of insulating material. The electronic structure may further comprise a dielectric cap layer situated inbetween the second layer of insulating material and the third layer of insulating material. The electronic structure may further comprise a first dielectric cap layer between the second layer of insulating material and the third layer of insulating material, and a second dielectric cap layer on top of the third layer of insulating material.

The dielectric cap material can be selected from silicon oxide, silicon nitride, silicon oxynitride, a refractory metal silicon nitride (wherein the refractory metal is selected from the group consisting of Ta, Zr, Hf and W) silicon carbide, carbon doped oxide or SiCOH and their hydrogenated compounds. The first and the second dielectric cap layers may be selected from the same group of dielectric materials. The first layer of insulating material may be silicon oxide or silicon nitride or doped varieties of these materials, such as phosphorus silicate glass ("PSG") or boron phosphorus silicate glass ("BPSG"). The electronic structure may further include a diffusion barrier layer of a dielectric material deposited on at least one of the second and third layers of insulating material. The electronic structure may further comprise a dielectric on top of the second layer of insulating material, which acts as a reactive ion etch ("RIE") hard mask and polish stop layer and a dielectric diffusion barrier layer on top of the dielectric RIE hard mask and polish stop layer. The electronic structure may further comprise a first dielectric RIE hard mask/polish-stop layer on top of the second layer of insulating material, a first dielectric RIE hard mask/diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further comprise a dielectric cap layer of same materials as mentioned above, between an interlevel dielectric of ultralow-k dielectric and an intralevel dielectric of ultralow-k dielectric.

BRIEF DESCRIPTION OF THE DRAWINGS

The foregoing objects, features and advantages of the present invention will become apparent from the following detailed description and the appended drawings in which.

DETAILED DESCRIPTION OF THE PREFERRED EMBODIMENTS OF THE INVENTION

Figure 1:
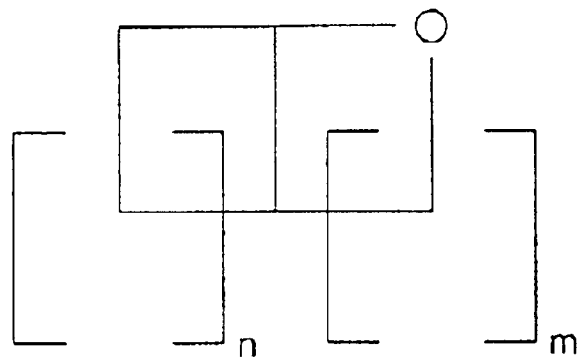
FIG. 1 depicts the general electronic structure of a bicyclic ether, also known as a oxabicyclic, which is a preferred compound for the second precursor. In this general schematic, the compound includes two rings, one of which contains an oxygen atom. The size of each ring is determined by the number of repeating methylene groups in each cycle, m and n. In a highly preferred case of cyclopentene oxide, m=0 and n=2.

The present invention discloses a method for fabricating a thermally stable ultralow dielectric constant film in a parallel plate plasma enhanced chemical vapor deposition ("PECVD") reactor. The material disclosed in the preferred embodiment contains a matrix of a hydrogenated oxidized silicon carbon material (SiCOH) comprising Si, C, O and H in a covalently bonded tri-dimensional network and having a dielectric constant of not more than about 2.6. The material may have a covalently bonded ring network. The material may comprise F and N and may optionally have the Si atoms partially substituted by Ge atoms. The material preferably contains molecular scale voids (i.e., nanometer-sized pores) of between about 0.3 to about 50 nanometers in diameter, and most preferably between about 0.4 and bout 10 nanometers in diameter, further reducing the dielectric constant to values below about 2.0. The nanometer-sized pores occupy a volume of between about 0.5% and about 50% of a volume of the material. More preferably, the dielectric constant for the ultralow-k film is in a range of about 1.6 to about 2.6, and most preferably the dielectric constant is in a range of about 1.8 to about 2.2. The inventive film preferably has a thickness of not more than about 1.3 micrometers and a crack propagation velocity in water of less than $10^{-9}$ meters per second. Most preferably, the film has a crack propagation velocity in water of less than $10^{-10}$ meters per second.

To produce an ultralow-k thermally stable film, a specific geometry of the deposition reactor with specific growth conditions is necessary. For instance, in the parallel plate reactor, a conductive area of the substrate chuck should be between about 300 $cm^2$ and about 700 $cm^2$, with a gap between the substrate and a top electrode between about 1 cm and about 10 cm. A RF power is applied to the substrate. In accordance with the present invention, the ultralow dielectric constant film is formed from a gas mixture of a cyclic siloxane precursor such as TMCTS and a second precursor, which is an organic molecule, selected from the group consisting of molecules with ring structures, such as cyclopentene oxide, in a specifically configured reaction reactor under specific reaction conditions. A third precursor comprising Ge may optionally be used to form the gas mixture from which the ultralow dielectric constant film is formed, thereby partially substituting Si atoms with atoms Ge atoms.

In accordance with another embodiment of the present invention, the ultralow dielectric constant film may be formed in presence of $CO_2$ or $CO_2$ and $O_2$. The low dielectric constant film of the present invention can further be heat treated at a temperature not less than about 300° C. for at least about 0.25 hour to reduce the dielectric constant. During this heat treatment step, molecule fragments derived from the second precursor gas (or gas mixture) comprising carbon and hydrogen and optionally oxygen atoms may thermally decompose and may be converted into smaller molecules which are released from the film. Optionally, further development of voids may occur in the film by the process of conversion and release of the molecule fragments. The film density is thus decreased.

The present invention provides a method for preparing a material that has an ultralow dielectric constant, i.e., lower than about 2.6, which is suitable for integration in a BEOL wiring structure. More preferably, the dielectric constant for the inventive ultralow-k film is in a range of about 1.6 to about 2.6 and, most preferably, the dielectric constant is in a range of about 2.0 to about 2.2. The inventive film can be prepared by choosing at least two suitable precursors and a specific combination of processing parameters as described herein below. Preferably, the first precursor is selected from molecules with ring structures comprising SiCOH components such as 1,3,5,7-tetramethylcyclotetrasiloxane (TMCTS or $C_4H_{16}O_4Si_4$) or octamethylcyclotetrasiloxane (OMCTS or $C_8H_{24}O_4Si_4$). More generally, the first precursor is of a class of cyclic alkylsiloxanes comprising a ring structure including an equivalent number of Si and O atoms bonded in an alternating fashion to which alkyl groups (such as methyl, ethyl, propyl or higher or branched analogs as well as cyclic hydrocarbons such as cyclopropyl, cyclopentyl, cyclohexyl, and higher analogs) are covalently bonded to at least one of the silicon atoms, including the cases where all the silicon atoms have two alkyl groups attached. Such alkyl groups may be similar or dissimilar. Additionally, the silicon atoms of such cyclic siloxanes may be bonded to hydrogen, in which case these compounds may be considered partially alkylated hydrosiloxanes.

The second precursor may be chosen from organic molecules, containing C, H, and O atoms and containing at least one ring, that have suitable volatility such that they may be introduced to the deposition reactor as a vapor by manipulation of temperature and pressure. Additionally, other atoms such as N, S, Si, or halogens may be contained in the precursor molecule. Additionally, more than one ring may be present in the precursor molecule. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics. Among the readily available examples of these, are 6-oxabicyclo[3.1.0]hexane or cyclopentene oxide (bp=102° C. at 760 mm Hg); 7-oxabicyclo[4.1.0]heptane or cyclohexene oxide (bp=129° C. at 760 mm Hg); 9-oxabicyclo[6.1.0]nonane or cyclooctene oxide (bp=55° C. at 5 mm Hg); and 7-oxabicyclo[2.2.1]heptane or 1,4-epoxycyclohexane (bp=119° C. at 713 mm Hg). More generally, species that fit the formula shown in FIG. 1 may be considered suitable.

Figure 2:
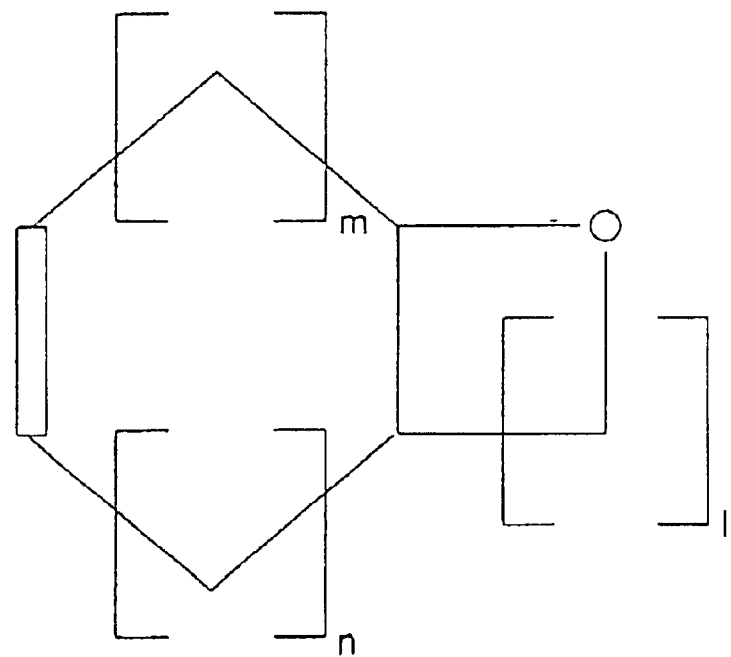
FIG. 2 depicts the general electronic structure of an unsaturated bicyclic ether, also known as a unsaturated oxabicyclic, which is a preferred compound for the second precursor. In this general schematic, the compound includes two rings, one of which contains an oxygen atom. The size of each ring is determined by the number of repeating methylene groups in each cycle, 1, m and n. The position of the unsaturated bond is determined by m and n. In the example of 9-oxabicylo[6.1.0]non-4-ene, 1=0, m=2 and n=2.

Additionally, the second precursor may have some degree of unsaturation as in 9-oxabicylo[6.1.0]non-4-ene (bp=195° C. at 760 mm Hg) or compounds of the general structure shown in FIG. 2. Furthermore, the second precursor may have additional functionalities including, but not limited to: ketones, aldehydes, amines, amides, imides, ethers, esters, anhydrides, carbonates, thiols, thioethers and the like, as in 7-oxabicyclo[4.1.0]heptan-2-one (bp=77° C. at 15 mmHg) and 3-oxabicyclo[3.1.0]hexane-2,4-dione (bp=100° C. at 5 mmHg).

As stated above, the inventive film may be prepared by choosing at least two suitable precursors. In some embodiments of the present invention, a third precursor material comprising Ge may optionally be utilized to form the ultralow dielectric constant film. In such an embodiment, the Ge atoms partially substitute the Si atoms in the inventive film.

Furthermore, the first precursor may further be mixed with $CO_2$ as a carrier gas or the first and second precursor gases may be mixed with $CO_2$ or a mixture of $CO_2$ and $O_2$ in the PECVD reactor. The addition of $CO_2$ to the first precursor as a carrier gas, or the addition of $CO_2$ or a mixture of $CO_2$ and $O_2$ to the first and second precursors in the PECVD reactor provides a stabilizing effect on plasma in the PECVD reactor and improves the uniformity of the film deposited on the substrate. When $CO_2$ is admixed with the first and second precursors, the amount of $CO_2$ may be from about 25 sccm to about 1000 sccm, and more preferably from about 50 sccm to about 500 sccm. When a mixture of $CO_2$ and $O_2$ is admixed with the first and second precursors, the amount of $CO_2$ admixed may be from about 25 sccm to about 1000 sccm and the amount of $O_2$ admixed may be from about 0.5 sccm to 50 sccm. More preferably, the amount of $CO_2$ is from about 50 sccm to about 500 sccm and the amount of $O_2$ is from about 1 sccm to about 30 sccm.

Figure 3:
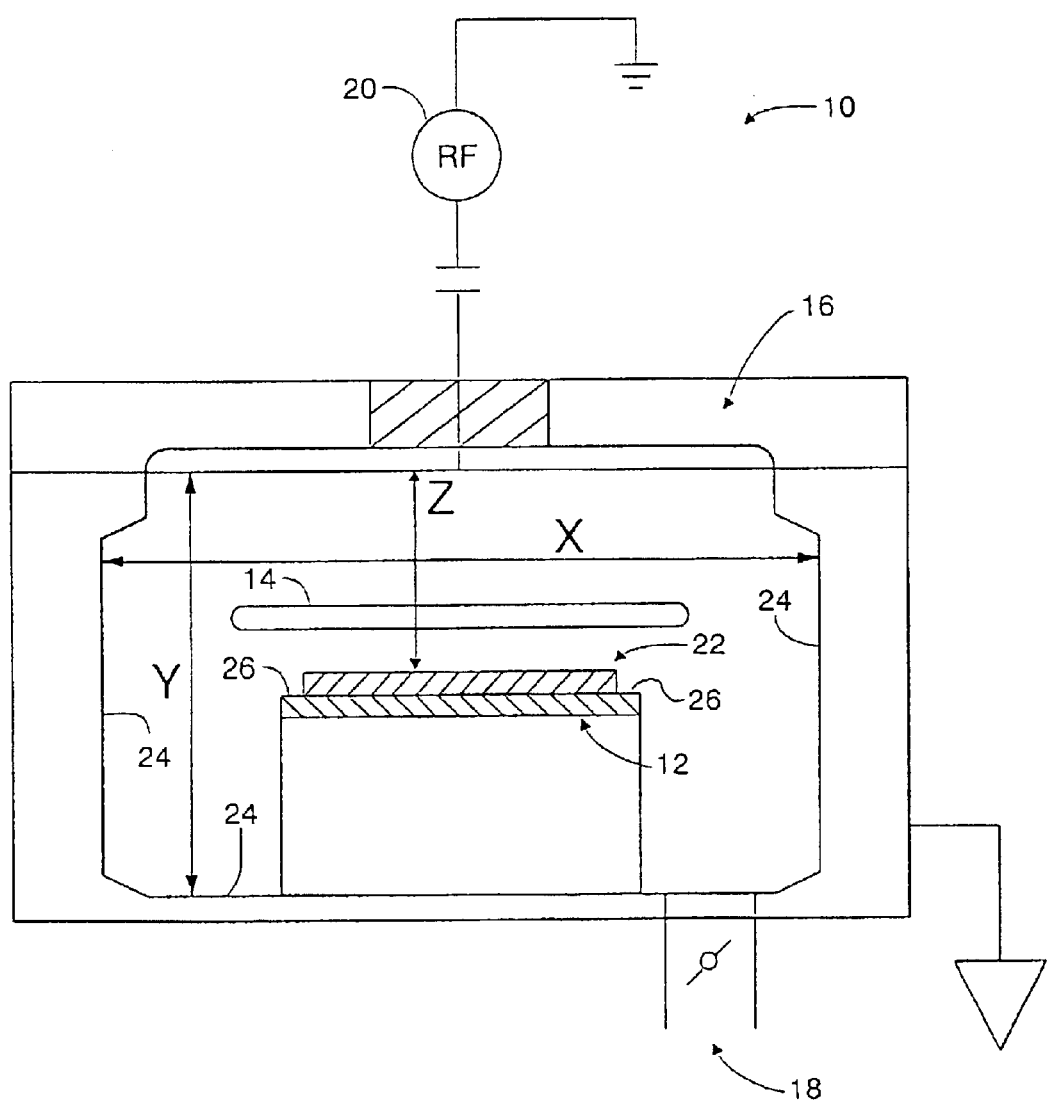
FIG. 3 depicts a cross-sectional view of a parallel plate chemical vapor deposition reactor according to the present invention.

As shown in FIG. 3, parallel plate plasma enhanced chemical vapor deposition ("PECVD) reactor 10 is the type used for processing 200 mm wafers. The inner diameter, X, of the reactor 10 is approximately 13 inches, while its height, Y, is approximately 8.5 inches. The diameter of substrate chuck 12 is approximately 10.8 inches. Reactant gases are introduced into reactor 10 through a gas distribution plate ("GDP") 16 that is spaced apart from substrate chuck 12 by a gap Z of about 1 inch, and are exhausted out of reactor 10 through a 3-inch exhaust port 18. RF power 20 is connected to GDP 16, which is electrically insulated from reactor 10, and substrate chuck 12 is grounded. For practical purposes, all other parts of the reactor are grounded. In a different embodiment, RF power 20 can be connected to substrate chuck 12 and transmitted to substrate 22. In this case, the substrate acquires a negative bias, whose value is dependent on the reactor geometry and plasma parameters. In another embodiment, more than one electrical power supply can be used. For instance, two power supplies can operate at the same RF frequency, or one may operate at a low frequency and one at a high frequency. The two power supplies may be connected both to the same electrode or to separate electrodes. In another embodiment, the RF power supply can be pulsed on and off during deposition. Process variables controlled during deposition of the low-k films are RF power, precursor mixture and flow rate, pressure in reactor, and substrate temperature.

Surfaces 24 of reactor 10 may be coated with an insulating coating material. For instance, one specific type of coating is applied on reactor walls 24 to a thickness of several mils. Another type of coating material that may be used on substrate chuck 12 is a thin coating of alumina or other insulator resistant to etching with an oxygen plasma. The temperature of the heated wafer chuck controls the substrate temperature.

In accordance the present invention, suitable first and second precursors and specific combination of processing parameters described herein above are employed such that the inventive ultralow-k material prepared preferably comprises: between about 5 and about 40 atomic percent of Si; between about 5 and about 45 atomic percent of C; between 0 and about 50 atomic percent of O; and between about 10 and about 55 atomic percent of H.

The main process variables controlled during a deposition process for a film are the RF power, the flow rates of the first, second and optionally third precursors, flow rate of $CO_2$, or flow rates of $CO_2$ and $O_2$, the reactor pressure and the substrate temperature. Provided herein below are several examples of deposition of films utilizing a first precursor tetramethylcyclotetrasiloxane (TMCTS) and a second precursor cyclopentene oxide ("CPO"), as well as deposition of films in presence of $CO_2$ or $CO_2$ and $O_2$, according to the present invention. In the examples 1–2, the TMCTS precursor vapors were transported into the reactor by using He as a carrier gas, while in the examples 3, the TMCTS was transported by a liquid delivery system. In the examples 5–7, the TMCTS precursor vapors were transported into the reactor using $CO_2$ as a carrier gas, while in the example 8, the TMCTS was transported by a liquid delivery system. Optionally, the films were heat treated at 400° C. after deposition to reduce k.

It should be emphasized that the fabrication method according to the present invention is only possible by utilizing a deposition reactor that has a specific geometry with uniquely defined growth conditions. When a reactor of different geometry is used under the defined growth conditions, the films produced may not achieve the ultralow dielectric constant. For instance, the parallel plate reactor according to the present invention should have an area of the substrate chuck of between about 300 $cm^2$ and about 700 $cm^2$, and preferably between about 500 $cm^2$ and about 600 $cm^2$. The gap between the substrate and the gas distribution plate (or top electrode) is between about 1 cm and about 10 cm, and preferably between about 1.5 cm and about 7 cm. A RF power is applied to one of the electrodes at a frequency between about 12 MHZ and about 15 MHZ, and preferably at about 13.56 MHZ. A low frequency, below 1 MHz, power can optionally be applied at the same electrode as the RF power, or to the opposite electrode at a power density of 0 to 0.3 $W/cm^2$.

The deposition conditions utilized are also critical to enable a successful implementation of the deposition process according to the present invention. For instance, a wafer temperature of between about 25° C. and about 325° C., and preferably of between about 60° C. and about 200° C. is utilized. A RF power density between about 0.05 $W/cm^2$ and about 1.0 $W/cm^2$, and preferably between about 0.25 $W/cm^2$ and about 0.8 W/cm² is utilized. A reactant gas flow rate of TMCTS is between about 5 sccm and about 1000 sccm, and preferably between about 25 sccm and about 200 sccm is utilized. A reactant gas flow rate of CPO between about 5 sccm and about 1000 sccm, and preferably between about 10 sccm and about 120 sccm is utilized. A reactant gas flow rate of Ge is between about 5 sccm and 1000 sccm, and preferably between about 5 sccm and about 50 sccm. A total reactant gas flow rate of TMCTS-CO₂, where CO₂ is used as a carrier gas is from about 25 sccm to about 1000 sccm, flow rates for CO₂ and O₂ mixture are respectively from about 25 sccm to 1000 sccm for CO₂ and from about 0.5 sccm to about 50 sccm for O₂, and flow rate for CO₂ from about 15 sccm to about 1000 sccm. A total reactant gas flow rate of TMCTS-CO₂, where CO₂ is used as a carrier gas is preferably from about 50 sccm to 500 sccm, flow rates for CO₂ and O₂ mixture are preferably respectively from about 50 sccm to about 500 sccm for CO₂ and from about 1 sccm to about 30 sccm for O₂, and flow rate for CO₂ preferably is from about 50 sccm to about 500 sccm. Reactor pressure during the deposition process between about 50 mTorr and about 5000 mTorr, and preferably between about 100 mTorr and about 3000 mTorr is utilized.

It should be noted that a change in the area of the substrate chuck by a factor, X, i.e., a change from a value in the range between about 300 cm² and about 700 cm², will change the RF power by a factor, X, from that previously specified. Similarly, a change in the area of the substrate chuck by a factor, Y, and a change in the gap between the gas distribution plate and the substrate chuck by a factor, Z, from that previously specified, will be associated with a change by a factor, YZ, in the gas flow rates from that previously specified. If a multistation deposition reactor is used, the area of the substrate refers to each individual substrate chuck and the flow rates of the gases refer to one individual deposition station. Accordingly, total flow rates and total power input to the reactor are multiplied by a total number of deposition stations inside the reactor.

The deposited films are stabilized before undergoing further integration processing. The stabilization process can be performed in a furnace-annealing step at about 300° C. to about 400° C. for a time period between about 0.5 hours and about 4 hours. The stabilization process can also be performed in a rapid thermal annealing process at temperatures above about 300° C. The dielectric constants of the films obtained according to the present invention are lower than about 2.6. The thermal stability of the films obtained according to the present invention in non-oxidizing ambient is up to at least a temperature of about 400° C.

The electronic devices formed according to the present invention are shown in FIGS. 6–9. It should be noted that the devices shown in FIGS. 6–9, are merely illustrated as examples according to the present invention, while countless other devices can also be formed according to the present invention.

Figure 6:
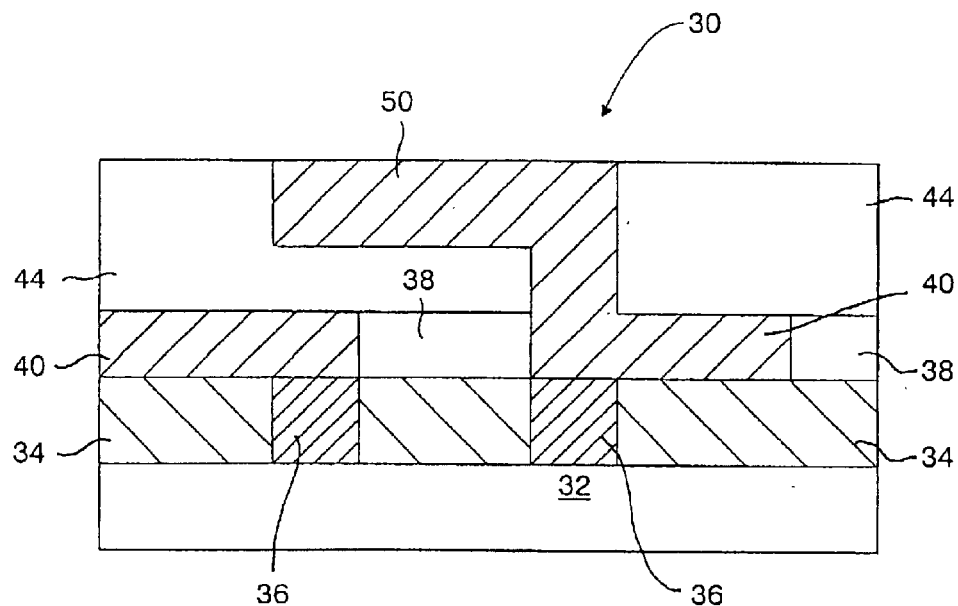
FIG. 6 depicts an enlarged, cross-sectional view of an electronic device having an intralevel dielectric layer and an interlevel dielectric layer of ultralow-k material according to the present invention.

FIG. 6 depicts electronic device 30 that is built on a silicon substrate 32. On top of silicon substrate 32, insulating material layer 34 is formed with a first region of metal 36 embedded therein. After a chemical mechanical polishing ("CMP") process is conducted on first region of metal 36, a film such as an ultralow-k film 38 is deposited on top of first layer of insulating material 34 and first region of metal 36. First layer of insulating material 34 may be suitably formed of silicon oxide, silicon nitride, doped varieties of these materials, or any other suitable insulating materials. Ultralow-k film 38 is patterned by a photolithography process and conductor layer 40 is deposited therein. After a CMP process on first conductor layer 40 is carried out, second layer of ultralow-k film 44 is deposited by a plasma enhanced chemical vapor deposition ("PECVD") process overlying first ultralow-k film 38 and first conductor layer 40. Conductor layer 40 may be deposited of a metallic conductive material or a non-metallic conductive material. For instance, a metallic conductive material of aluminum or copper, or a non-metallic material such as nitride or polysilicon may be utilized. First conductor 40 is in electrical communication with first region of metal 36.

A second region of conductor 50 is formed, after a photolithographic process in second ultralow-k film layer 44 is conducted, followed by a deposition process for the second conductor material. Second conductor 50 may also be deposited of either a metallic material or a non-metallic material, similar to that used in depositing the first conductor layer 40. The second region of conductor 50 is in electrical communication with the first region of conductor 40 and is embedded in the second layer of ultralow-k insulator 44. The second layer of ultralow-k film is in intimate contact with the first layer of insulating material 38. In this specific example, the first layer of insulating material 38, which is an ultralow-k material according to the present invention, serves as an intralevel dielectric material, while the second layer of insulating material, i.e., the ultralow-k film 44, serves as both an intralevel and an interlevel dielectric. Based on the low dielectric constant of the ultralow-k film, superior insulating property can be achieved by first insulating layer 38 and second insulating layer 44.

Figure 7:
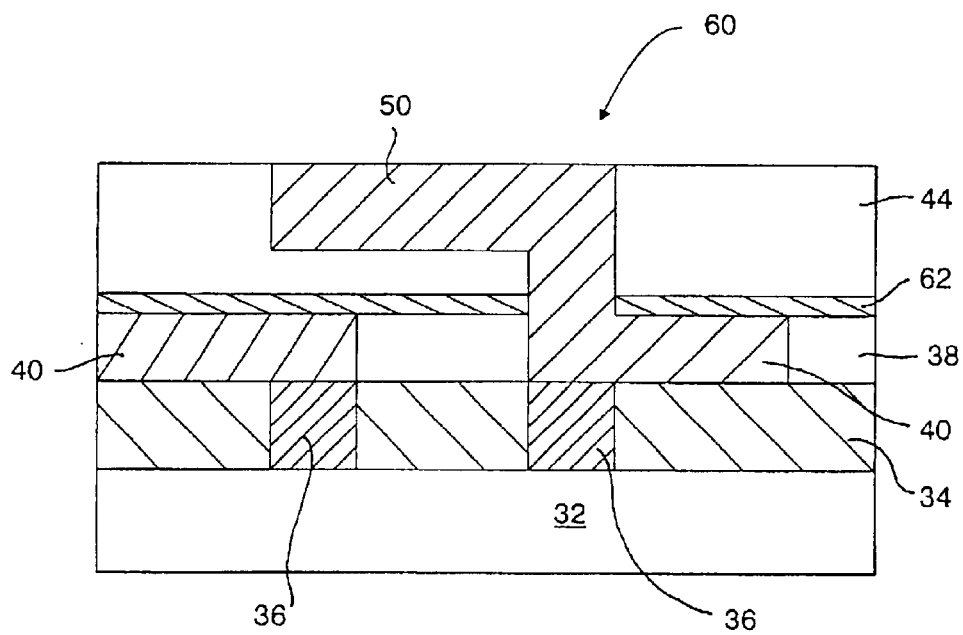
FIG. 7 depicts an enlarged, cross-sectional view of the electronic structure of FIG. 6 having an additional diffusion barrier dielectric cap layer on top of ultralow-k material film according to the present invention.

FIG. 7 depicts electronic device 60 according to the present invention, similar to that of electronic device 30 shown in FIG. 6, but with additional dielectric cap layer 62 deposited between first insulating material layer 38 and second insulating material layer 44. Dielectric cap layer 62 can be suitably formed of a material such as silicon oxide, silicon nitride, silicon oxynitride, silicon carbide, silicon carbo-oxide (SiCO), modified ultralow-k and their hydrogenated compounds, as well as refractory metal silicon nitride, wherein the refractory metal is selected the group consisting of: Ta, Zr, Hf, and W. Additional dielectric cap layer 62 functions as a diffusion barrier layer for preventing diffusion of first conductor layer 40 into second insulating material layer 44 or into the lower layers, especially into layers 34 and 32.

Figure 8:
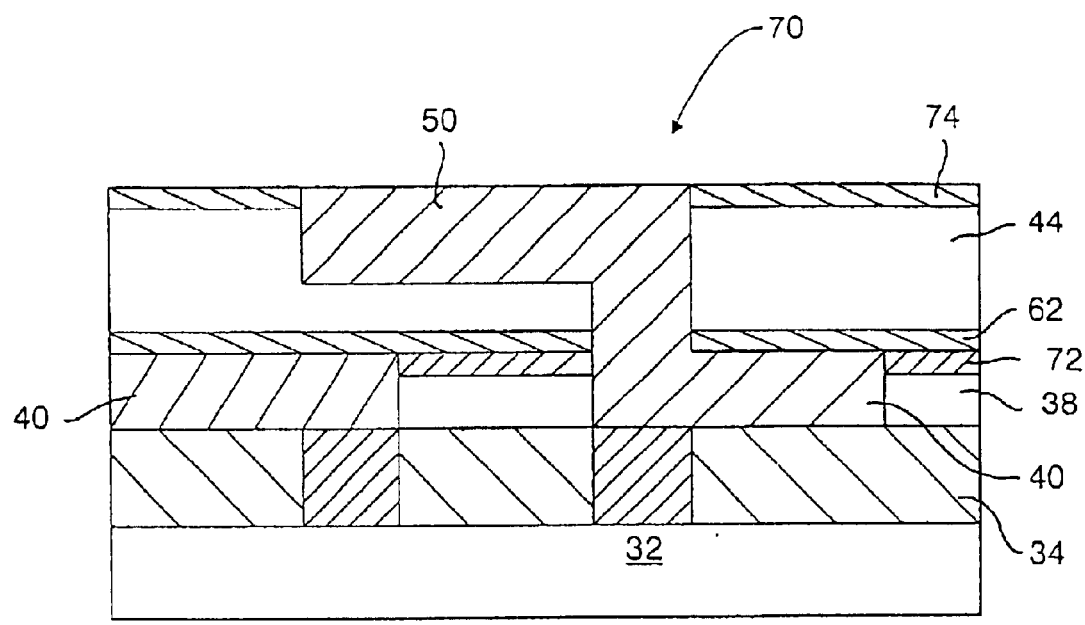
FIG. 8 depicts an enlarged, cross-sectional view of the electronic structure of FIG. 7 having an additional RIE hard mask/polish-stop dielectric cap layer and dielectric cap diffusion barrier on top of the polish-stop layer according to the present invention.

FIG. 8 depicts another alternate embodiment of electronic device 70 according to the present invention. In electronic device 70, two additional dielectric cap layers 72 and 74 that act as an RIE mask and CMP (chemical-mechanical polishing) polish stop layer are used. First dielectric cap layer 72 is deposited on top of first insulating material layer 38. The function of dielectric layer 72 is to provide an end point for the CMP process utilized in planarizing first conductor layer 40. Polish stop layer 72 can be deposited of a suitable dielectric material such as silicon oxide, silicon nitride, silicon oxynitride, silicon carbide, silicon carbo-oxide (SiCO), modified ultralow-k and their hydrogenated compounds, as well as refractory metal silicon nitride, wherein the refractory metal is selected from the group consisting of: Ta, Zr, Hf and W. The top surface of dielectric layer 72 is at the same level as first conductor layer 40. A second dielectric layer 74 can be added on top of second insulating material layer 44 for the same purposes.

Figure 9:
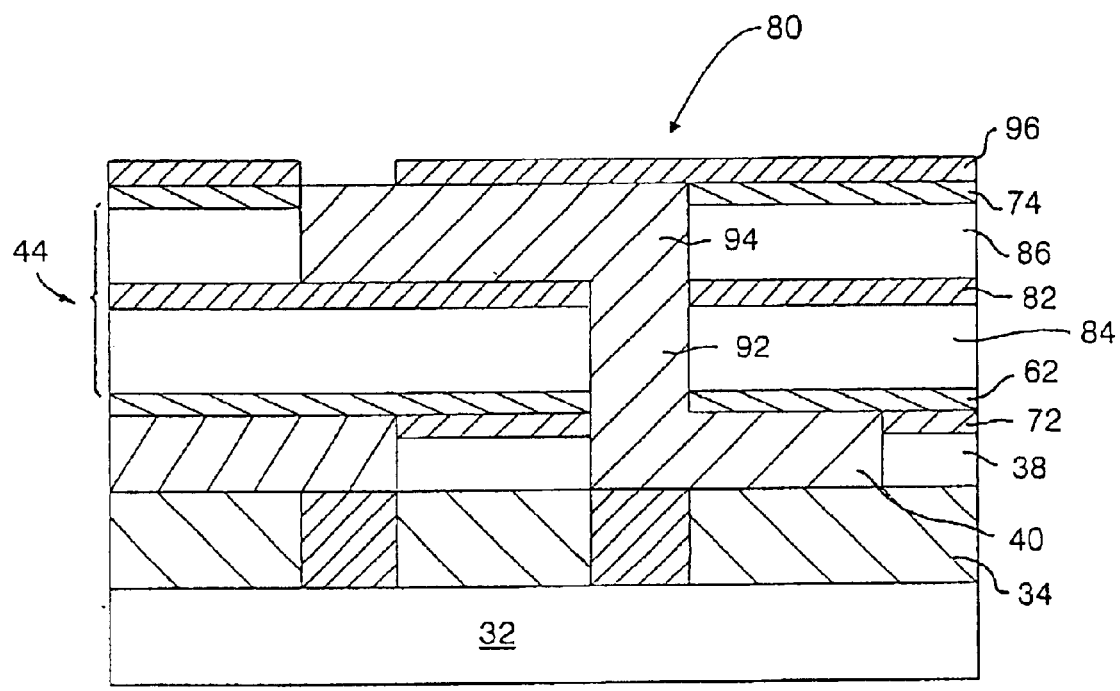
FIG. 9 depicts an enlarged, cross-sectional view of the electronic structure of FIG. 8 having additional RIE hard mask/polish-stop dielectric layers on top of the interlevel ultralow-k material film according to the present invention.

FIG. 9 depicts still another alternate embodiment of electronic device 80 according to the present invention. In this alternate embodiment, an additional layer of dielectric 82 is deposited and thus divides second insulating material layer 44 into two separate layers 84 and 86. Intralevel and interlevel dielectric layer 44, as depicted in FIG. 8, is therefore divided into interlayer dielectric layer 84 and intralevel dielectric layer 86 at the boundary between interconnect 92 and interconnect 94, as depicted in FIG. 9. An additional diffusion barrier layer 96 is further deposited on top of the upper dielectric layer 74. The additional benefits provided by this alternate embodiment of the electronic structure 80 is that the dielectric layer 82 acts as a RIE etch stop providing superior interconnect depth control.

The following examples are presented to illustrate the fabrication of the ultralow-k dielectric film in accordance with the present invention as well as to demonstrate advantages that can be obtained therefrom:

EXAMPLE 1

In this example, according to FIG. 3, a wafer is first prepared by introducing the wafer into reactor 10 through a slit valve 14 and pre-etching the wafer by argon gas. In this wafer preparation process, the wafer temperature is set at about 180° C. and the argon flow rate is set at about 25 sccm, to achieve a pressure of about 100 mTorr. A RF power is then turned on to about 125 W for about 60 seconds. The RF power and the argon gas flow are then turned off.

The TMCTS precursor is carried into the reactor reactor using He as a carrier gas; He is at a pressure of about 5 psig at the inlet to the TMCTS container. The ultralow-k film according to the present invention can be deposited by first establishing gas flows of TMCTS+He and CPO to desired flow rates and pressure, i.e., at about 20 sccm of TMCTS+He and about 6 sccm of CPO and about 100 mTorr. A RF power is then turned on at about 15 W for a time period of about 50 minutes. The RF power and the gas flow are then turned off. The wafer is then removed from reaction reactor 10.

To reduce the dielectric constant of the deposited films and to further improve their thermal stability, i.e., to make them stable at temperatures greater than 300° C., the films are post annealed to evaporate the volatile contents and to dimensionally stabilize the films. The post annealing process can be carried out in an annealing furnace by the following steps. The furnace is first purged for about 5 minutes (with the film samples in a load station) with nitrogen at a flow rate of about 10 liters/minute. The film samples are then transferred into the furnace reactor to start the post annealing cycle of heating the films to about 280° C. at a heating rate of about 5° C./minute, holding at about 280° C. for about 5 minutes, heating at a second heating rate of about 5° C./minute to about 400° C., holding at about 400° C. for about 4 hours, turning the furnace off and allowing the film samples to cool to a temperature of below about 100° C. A suitable first holding temperature may be between about 280° C. and about 300° C., while a suitable second holding temperature may be between about 300° C. and about 400° C.

Figure 4:
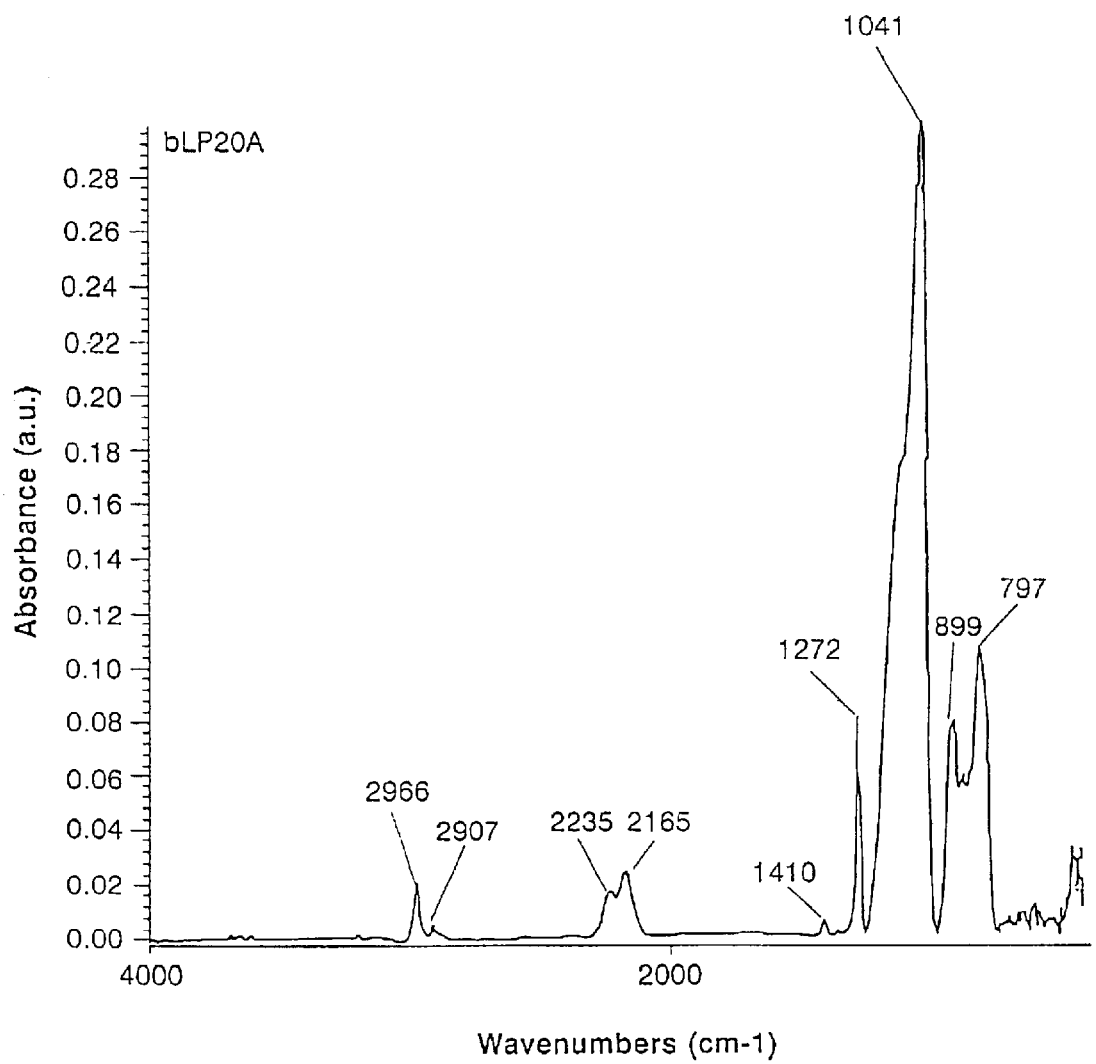
FIG. 4 depicts a Fourier Transform Infrared ("FTIR") spectrum obtained from a SiCOH film deposited from a mixture of tetramethylcyclotetrasiloxane ("TMCTS") and He.
Figure 5:
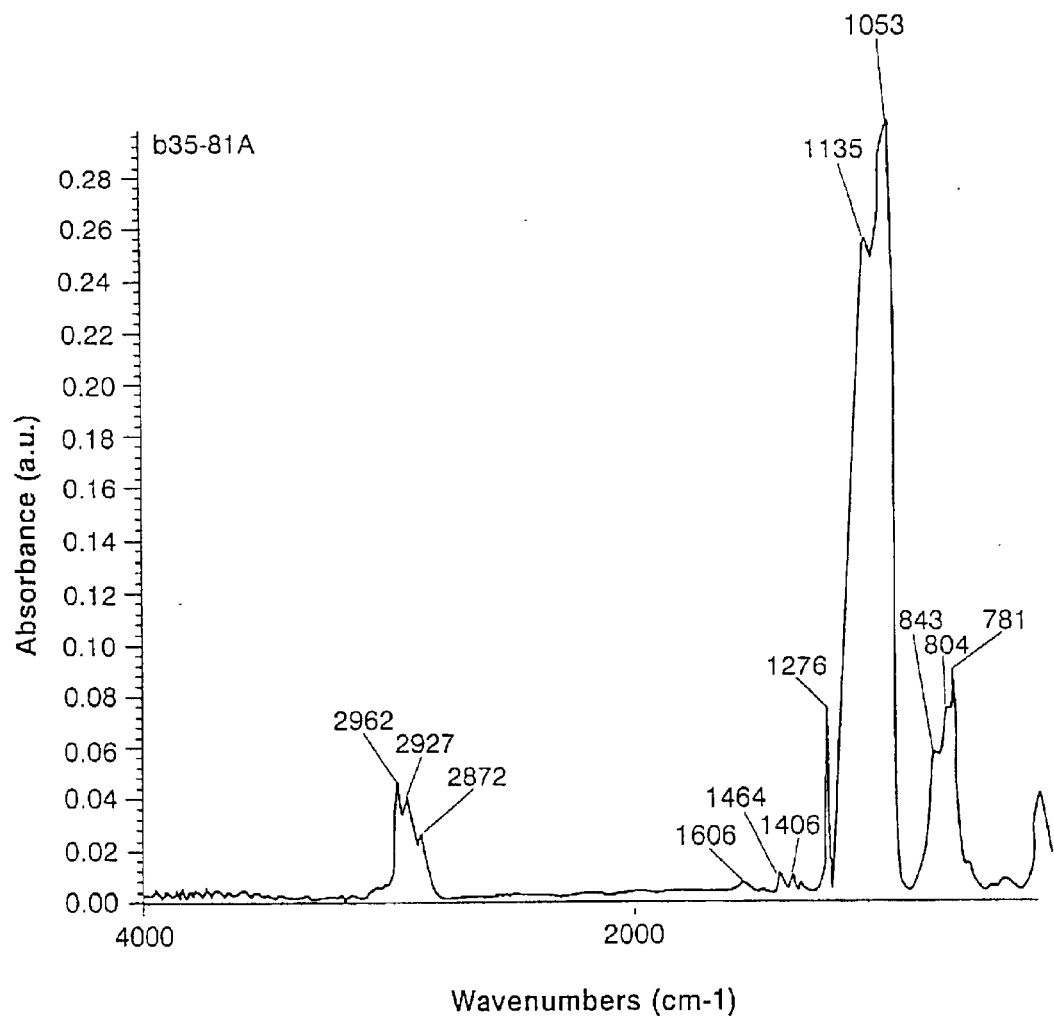
FIG. 5 depicts a FTIR spectrum obtained from the inventive ultralow-k material deposited from a mixture of TMCTS+He and cyclopentene oxide according to the present invention.

Results of the first embodiment are now discussed in reference to FIGS. 4 and 5. FIG. 4 presents a Fourier transform infrared ("FTIR") spectrum of a typical SiCOH film. The spectrum displays a strong Si—O absorption band at about 1000–1100 cm$^{-1}$, a Si—CH$_3$ absorption peak at about 1275 cm$^{-1}$, a Si—H absorption band at about 2150–2250 cm$^{-1}$ and small C—H absorption peaks at about 2900–3000 cm$^{-1}$. The relative intensities of the CH, SiH and SiCH$_3$ peaks as compared to the SiO peak of the SiCOH film are presented in Table 1 herein below.

FIG. 5 presents the FTIR spectrum obtained from an ultralow-k film prepared from a mixture of (TMCTS+He)+ CPO in accordance with the present invention. The spectrum displays the Si—O, Si—CH$_3$, and C—H absorption peaks, as in FIG. 4. However, the Si—H peak is missing, the intensity of the C—H absorption band at about 2900–3000 cm$^{-1}$ is much stronger for the ultralow-k film than for the SiCOH film shown in FIG. 4. The relative intensities of the CH, and SiCH$_3$ peaks as compared to the SiO peak for this film are also shown in Table 1. As particularly illustrated in Table 1, the integrated area of C—H peak of the ultralow-k film is 40% of the Si—CH$_3$ peak, while it is only 2% of the Si—CH$_3$ peak in the SiCOH film. This is a clear indication that the ultralow-k film contains a significant amount of a secondary CH$_x$ (hydrocarbon) phase in addition to the SiCOH phase. Another characteristic of the FTIR spectrum of the ultralow-k film is the splitting of the Si—O peak into two peaks at about 1139 cm$^{-1}$ and about 1056 cm$^{-1}$, as particularly illustrated in FIG. 5.

TABLE 1

Relative integrated intensities of FTIR absorption peak

| MATERIAL | CH/SiO (%) | SiH/SiO (%) | SiCH/SiO (%) |
|---|---|---|---|
| SiCOH | 2 | 7 | 5 |
| Ultralow-k | 10 | 0 | 4 |

EXAMPLE 2

In this example, a wafer is prepared as described in Example 1, but the wafer temperature is set at about 300° C. The TMCTS precursor is then carried into the reactor using He as a carrier gas; He is at a pressure of about 5 psig at the inlet to the TMCTS container. The ultralow-k film according to the present invention can be deposited by first establishing gas flows of TMCTS+He and CPO to desired flow rates and pressure, i.e., at about 150 sccm of TMCTS+He and about 50 sccm of CPO and about 2000 mTorr. A RF power is then turned on at about 150 W for a time period of about 10 minutes. The RF power and the gas flow are then turned off. The wafer is then removed from the reaction reactor 10 and annealed as described in Example 1.

EXAMPLE 3

In this example, a reactor containing 6 deposition stations is used. The temperature of the wafer chuck is set at about 350° C. The TMCTS precursor is carried into the reactor using a liquid delivery system at a flow rate of at about 5 ml/min and the CPO is flown at a rate of about 900 sccm and the pressure is stabilized at about 3000 mTorr. A total RF power of about 600 W and a low frequency power of about 300 W are applied to the reactor. The ultralow-k film deposition is performed on the wafer at each station with the wafer moving to the next station after a preset time interval. The wafer is removed from the reaction reactor after passing the last deposition station, and annealed as described in Example 1.

In the foregoing examples, the plasma was operated in a continuous mode. In Example 4 herein below, the plasma is operated in a pulsed mode.

EXAMPLE 4

In this example, the deposition is performed under conditions similar to Example 1, but the plasma is operated in a pulsed mode, i.e., with a duty cycle of about 50% and a plasma-on time of about 50 msec to about 100 msec. After removal of the wafer from reactor 10, the wafer with the deposited film is annealed as described in Example 1.

As described in the foregoing examples, the films that are prepared have dielectric constants in the range of about 1.8 to about 2.2.

EXAMPLE 5

In this example, according to FIG. 3, a wafer is first prepared by introducing the wafer into reactor 10 through a slit valve 14 and pre-etching the wafer by argon gas. In this wafer preparation process, the wafer temperature is set at about 180° C. and the argon flow rate is set at about 25 sccm, to achieve a pressure of about 100 mTorr. A RF power is then turned on to about 125 W for about 60 seconds. The RF power and the argon gas flow are then turned off.

The TMCTS precursor is carried into the reactor reactor using $CO_2$ as a carrier gas; $CO_2$ is at a pressure of about 5 psig at the inlet to the TMCTS container. The ultralow-k film according to the present invention can be deposited by first establishing gas flows of TMCTS+$CO_2$ and CPO to desired flow rates and pressure, i.e., at about 20 sccm of TMCTS+$CO_2$ and about 10 sccm of CPO and about 100 mTorr. A RF power is then turned on at about 15 W for a time period of about 50 minutes. The RF power and the gas flow are then turned off. The wafer is then removed from reaction reactor 10.

To reduce the dielectric constant of the deposited films and to further improve their thermal stability, i.e., to make them stable at temperatures greater than 300° C., the films are post annealed to evaporate the volatile contents and to dimensionally stabilize the films. The post annealing process can be carried out in an annealing furnace by the following steps. The furnace is first purged for about 5 minutes (with the film samples in a load station) with nitrogen at a flow rate of about 10 liters/minute. The film samples are then transferred into the furnace reactor to start the post annealing cycle of heating the films to about 280° C. at a heating rate of about 5° C./minute, holding at about 280° C. for about 5 minutes, heating at a second heating rate of about 5° C./minute to about 400° C., holding at about 400° C. for about 4 hours, turning the furnace off and allowing the film samples to cool to a temperature of below about 100° C. A suitable first holding temperature may be between about 280° C. and about 300° C., while a suitable second holding temperature may be between about 300° C. and about 400° C.

EXAMPLE 6

In this example, a wafer is prepared as described in Example 5, but the wafer temperature is set at about 300° C. The TMCTS precursor is then carried into the reactor using $CO_2$ as a carrier gas; $CO_2$ is at a pressure of about 5 psig at the inlet to the TMCTS container. The ultralow-k film according to the present invention can be deposited by first establishing gas flows of TMCTS+$CO_2$ and CPO to desired flow rates and pressure, i.e., at about 150 sccm of TMCTS+$CO_2$ and about 75 sccm of CPO and about 2000 mTorr. A RF power is then turned on at about 150 W for a time period of about 10 minutes. The RF power and the gas flow are then turned off. The wafer is then removed from the reaction reactor 10 and annealed as described in Example 5.

In the foregoing examples, the plasma was operated in a continuous mode. In Example 3 herein below, the plasma is operated in a pulsed mode.

EXAMPLE 7

In this example, the deposition is performed under conditions similar to Example 5, but the plasma is operated in a pulsed mode, i.e., with a duty cycle of about 50% and a plasma-on time of about 50 msec to about 100 msec. After removal of the wafer from reactor 10, the wafer with the deposited film is annealed as described in Example 5.

EXAMPLE 8

In this example, a reactor including 6 deposition stations is used. The temperature of the wafer chuck is set at about 350° C. The TMCTS precursor is carried into the reactor using a liquid delivery system at a flow rate of about 5 ml/min, the CPO being flown at a rate of about 250 sccm and the pressure being stabilized at about 4000 mTorr. The $CO_2$ at a flow rate of about 5000 sccm and $O_2$ at a flow rate of about 250 sccm are admixed with the gas mixture of TMCTS and CPO in the reactor. The addition of the $CO_2$ and $O_2$ mixture stabilizes the plasma and improves the film uniformity. A total high frequency RF power of about 600 W and a low frequency RF power of about 300 W are applied to the reactor. The ultralow-k film deposition is performed on the wafer at each station with the wafer moving to the next station after a preset time interval. The wafer is removed from the reactor after passing the last deposition station, and the wafer may further be optionally annealed as particularly described in Example 5 hereinabove.

A rapid thermal annealing ("RTA") process may also be used to stabilize ultralow-k films. The films obtained according to the present invention, are characterized by dielectric constants k less than about 2.6, and are thermally stable for integration in a back-end-of-the-line ("BEOL") interconnect structure, which is normally processed at temperatures of up to about 400° C. The teachings of the present invention can therefore be easily adapted in producing films as intralevel and interlevel dielectrics in back-end-of-the-line processes for logic and memory devices.

The method and electronic structures formed according to the present invention have therefore been thoroughly demonstrated in the above descriptions and in the appended drawings of FIGS. 1–9. It should be emphasized that the examples of the electronic structures shown in FIGS. 6–9 are merely used to illustrate the inventive method that can be applied in the fabrication of countless electronic devices.

While the present invention has been described in an illustrative manner, it should be understood that the terminology used is intended to be in a nature of words of description rather than of limitation.

Furthermore, while the present invention has been particularly shown and described with respect to a preferred embodiment and several alternate embodiments, it is to be appreciated that those skilled in the art may readily apply these teachings to other possible variations of the present invention without departing from the spirit and scope of the present invention.

What is claimed is:

1. A dielectric material comprising elements of Si, C, O and H, said dielectric material having a covalently bonded random tri-dimensional network structure, a multiplicity of nanometer-sized pores, a dielectric constant of not more than 2.6 and an FTIR spectrum having an Si-O absorption band at about 1000–1100 cm$^{-1}$ that is split into two peaks, and wherein the spectrum is absent of any Si-H absorption band at about 2150–2250 cm$^{1}$.

2. The dielectric material according to claim 1, wherein said dielectric constant is in a range from about 1.6 to about 2.6.

3. The dielectric material according to claim 1, wherein said dielectric constant is in a range from about 1.8 to about 2.2.

4. The dielectric material according to claim 1, wherein said dielectric constant is not more than 2.2.

5. The dielectric material according to claim 1, wherein said dielectric constant is not more than 2.1.

6. The dielectric material according to claim 1, wherein said covalently bonded random tri-dimensional structure comprises Si—O, Si—C, Si—H, C—H and C—C bonds.

7. The dielectric material according to claim 1, wherein said dielectric material comprises:

between about 5 and about 40 atomic percent of Si;

between about 5 and about 45 atomic percent of C;

between 0 and about 50 atomic percent of O; and between about 10 and about 55 atomic percent of H.

8. The dielectric material according to claim 1, wherein said dielectric material further has a covalently bonded ring network.

9. The dielectric material according to claim 1, wherein said dielectric material is thermally stable to a temperature of at least 350° C.

10. The dielectric material according to claim 1, wherein said Si is at least partially substituted by Ge.

11. The dielectric material according to claim 1, wherein said dielectric material further comprises at least one element selected from the group consisting of: F, N and Ge.

12. The dielectric material according to claim 1, wherein diameters of said multiplicity of nanometer-sized pores are between about 0.3 and about 50 nanometers.

13. The dielectric material according to claim 1, wherein diameters of said multiplicity of nanometer-sized pores are between about 0.4 and about 10 nanometers.

14. The dielectric material according to claim 1, wherein said multiplicity of nanometer-sized pores occupies a volume between about 0.5% and about 50% of a volume of said dielectric material.

15. The dielectric material according to claim 1, wherein said dielectric material has a thickness of not more than 1.3 micrometers and a crack propagation velocity in water of less than $10^{-9}$ meters per second.

16. The dielectric material according to claim 1, wherein said dielectric material has a thickness of not more than 1.3 micrometers and crack propagation velocity in water of less than $10^{10}$ meters per second.

17. An interconnect structure comprising a dielectric material as an insulator, cap or hardmask layer, said dielectric material comprising elements of Si, C, O and H, having a covalently bonded random tri-dimensional network structure, a multiplicity of nanometer-sized pores, a dielectric constant of not more than 2.6 and an FTIR spectrum having an Si—O absorption band at about 1000–1100 $cm^{-1}$ that is split into two peaks, and wherein the spectrum is absent of any Si—H absorption band at about 2150–2250 $cm^1$.

* * * * *